United States Patent [19]
Temes et al.

[11] Patent Number: 5,369,403
[45] Date of Patent: Nov. 29, 1994

[54] DUAL QUANTIZATION OVERSAMPLING DIGITAL-TO-ANALOG CONVERTER

[75] Inventors: Gabor C. Temes; Shao-Feng Shu, both of Corvallis, Oreg.

[73] Assignee: The State of Oregon Acting by and Through the State Board of Higher Education on Behalf of Oregon State University, Eugene, Oreg.

[21] Appl. No.: 939,102

[22] Filed: Sep. 1, 1992

[51] Int. Cl.$^5$ .......................................... H03M 3/02
[52] U.S. Cl. ................................. 341/143; 341/145
[58] Field of Search ................ 341/118, 143, 145, 150

[56] References Cited

U.S. PATENT DOCUMENTS

| | | | |
|---|---|---|---|
| 4,467,316 | 8/1984 | Musmann et al. | 341/144 |
| 4,772,871 | 9/1988 | Suzuki et al. | 341/155 |
| 4,939,516 | 7/1990 | Early | 341/143 |
| 4,943,807 | 7/1990 | Early et al. | 341/120 |
| 4,987,416 | 1/1991 | Leslie | 341/118 |
| 5,027,120 | 6/1991 | Thurston | 341/143 |
| 5,027,306 | 6/1991 | Dattorro et al. | 364/724.10 |
| 5,039,989 | 8/1991 | Welland et al. | 341/143 |

FOREIGN PATENT DOCUMENTS 2223369  4/1990  United Kingdom .

OTHER PUBLICATIONS

ISSCC91/Session 4/Oversampling-Converters/Paper WP 4.5 WPM 4.5: A Bitstream Digital-to-Analog Converter with 18b Resolution by Ben M. J. Kpu, Eise C. Kijkmans, Hans Naus, Jack Sneep; paper plus attachments.

An Improved Sigma-Delta Modulator Architecture by T. C. Leslie and B. Singh, pp. 372 through 375.

Digitally Corrected Multi-Bit ΣΔ Data Converters by T. Cataltepe, A. R. Kramer, L. E. Larson, G. C. Temes and R. H. Walden, pp. 647 through 650.

Sec. 14-36 Modulators, Demodulators, and Converters, pp. 14-42 through 14-46.

IEEE Jouranl of Solid-State Circuits, vol. SC-22, No. 3, Jun. 1987 A CMOS Stereo 16-bit D/A Converter For Digital Audio by Peter J. A. Naus, Eise Carel Kijkmans, Eduard F. Stikvoort, Andrew J. McKnight, David J. Holland, and Werner Bradinal, pp. 390 through 394.

IEEE Journal of Solid-State Circuits, vol. 24, No. 4, Aug. 1989 A 17-bit Oversampling D-to-A Conversion Technology Using Multistage Noise Shaping by Yasuyuki Matsuya, Kunihara Uchimura, Atsushi Iwata, Member, EEEE, and Takao Kaneko, pp. 969 through 975.

The Institute of Electrical and Electronics Engineers, Inc., New York Oversampling-Delta-Sigma Data Converters Theory, Design, and Simulation by James C. Candy and Gabor C. Temes, pp. 1 through 29.

ISSCC91/Session 4/Oversampling-Converters/Paper WP 4.7 WPM 4.7: A 16b Oversampling CODEC with Filtering DSP by Toshiyuki Okamoto, Yuichi Maruyama, Kiyonobu Hinooka, Akira Yukawa; paper plus attachments.

*Primary Examiner*—Marc S. Hoff
*Attorney, Agent, or Firm*—Klarquist Sparkman Campbell, Leigh & Whinston

[57] ABSTRACT

An oversampling D/A converter system achieves high linearity and low quantization error by using dual internal D/A converters: one with high linearity but high quantization error and the other with low linearity but low quantization error. A signal path in the system includes an L-bit quantizer for quantizing a digital input signal into an L-bit signal plus a quantization error and a D/A converter for converting the L-bit signal and quantization error into an analog signal. A correction path that parallels the signal path includes an M-bit quantizer, where M is greater than L, and an M-bit D/A converter. A signal generated by the correction path cancels the shaped quantization error of the signal generated by the signal path by adding the negative of the shaped quantization error to the signal of the signal path. The resulting analog signal is filtered by a lowpass analog filter to extract the analog equivalent of the digital input signal. Various arrangements of filter stages are also disclosed for constructing preferred implementations of the oversampling D/A converter.

18 Claims, 6 Drawing Sheets

DUAL QUANTIZATION OVERSAMPLING DIGITAL-TO-ANALOG CONVERTER

BACKGROUND OF THE INVENTION

This invention relates generally to a class of oversampling digital-to-analog converters, known as delta-sigma converters. More particularly, this invention relates to an oversampling digital-to-analog converter with high linearity and low quantization error.

Oversampling digital-to-analog (D/A) converters have become increasingly popular because they avoid many of the difficulties encountered with conventional D/A converters. Conventional converters have attributes that make their circuits difficult to implement in fine-line VLSI technology. Chief among these is the use of analog filters, the need for high-precision analog circuits, and the vulnerability of conventional D/A converters to noise and interference. On the other hand, the virtue of conventional D/A converters is their use of a relatively low sampling frequency, usually the Nyquist rate of the signal (i.e., twice the rate of the signal bandwidth).

oversampling delta-sigma D/A converters typically contain a digital interpolation filter (IF) stage followed by a noise-shaping loop (NL), an internal single-bit D/A converter and an analog low-pass filter (LPF) for extracting the original signal. The IF stage samples the digital input signal at an increased sampling rate. The NL stage quantizes the oversampling data into a single-bit data stream. The single-bit data stream is converted into an analog signal by the single-bit D/A converter, which is inherently linear and thus does not distort the input signal in the conversion process. The analog output signal of the single-bit D/A converter contains the desired analog signal. However, the output signal of the D/A converter also contains a large amount of out-of-band quantization noise which must be removed by the analog low-pass filter.

Because of the nature of the out-of-band quantization noise, the realization of the analog low-pass filter is complex and difficult. The quantized signal is a density-modulated square wave with a large amplitude as well as steep slopes. Moreover, the linearity of the low-pass filter is also difficult to maintain in the presence of such a large and fast-changing signal.

One way to reduce the complexity of the low-pass filter is to utilize a multibit rather than a single-bit data stream and multibit internal D/A converter. Every extra bit in the data stream reduces the quantization noise by about six decibels (dB) and also reduces the rate of change of the signal. However, the multibit D/A converter is directly in the signal path, and hence any nonlinearity in its characteristics introduces harmonic distortion and additional noise into the passband of the input signal.

The present invention achieves the linear output provided by a single-bit D/A converter while reducing the quantization noise and rate of change of the signal to that obtainable by a multibit D/A converter. The design requirements for the low-pass filter are thus considerably reduced and its linearity more easily maintained.

SUMMARY OF THE INVENTION

An object of the invention, therefore, is to provide an improved oversampling D/A converter with higher linearity and lower quantization error than conventional oversampling D/A converters.

Another object of the invention is to provide an oversampling D/A converter which can be realized using a simpler analog low-pass filter.

An oversampling D/A converter according to the invention includes a number of elements that cooperate to achieve these objects of the invention. A first quantizer in a noise-shaping loop quantizes a digital input signal into an L-bit digital signal, the quantizer also producing an L-bit quantization error. A linear D/A converter converts the L-bit digital signal into a first analog signal, the first analog signal including the quantization error. A second quantizer in a noise-shaping loop quantizes the error signal into an M-bit digital signal, where M is greater than L. An M-bit D/A converter then converts the M-bit digital signal into a second analog signal. The first and second analog signals are combined at a node into an output signal to cancel the L-bit quantization error. The remaining quantization error is due to the M-bit quantizer, which is also noise shaped, and which is much smaller (by about (M-L*6 dB) than the cancelled error. The output signal may then be passed through a simple low-pass filter to extract the analog equivalent of the digital input signal.

A method for converting a digital signal to an analog signal according to the invention thus comprises the following steps. An oversampled digital input signal is quantized into an L-bit digital signal and the L-bit digital signal is linearly converted into a first analog signal. An L-bit quantization error signal produced as a result of quantizing the digital input signal is itself quantized into an M-bit digital signal, where M is greater than L. The M-bit digital signal is then converted into a second analog signal and combined with the first analog signal to eliminate the L-bit quantization error, producing an analog output signal essentially free of the quantization error.

The foregoing and other objects, features, and advantages of the invention will become more apparent from the following detailed description of a preferred embodiment and accompanying drawings.

DESCRIPTION OF PREFERRED EMBODIMENTS

General Structure

Figure 1:
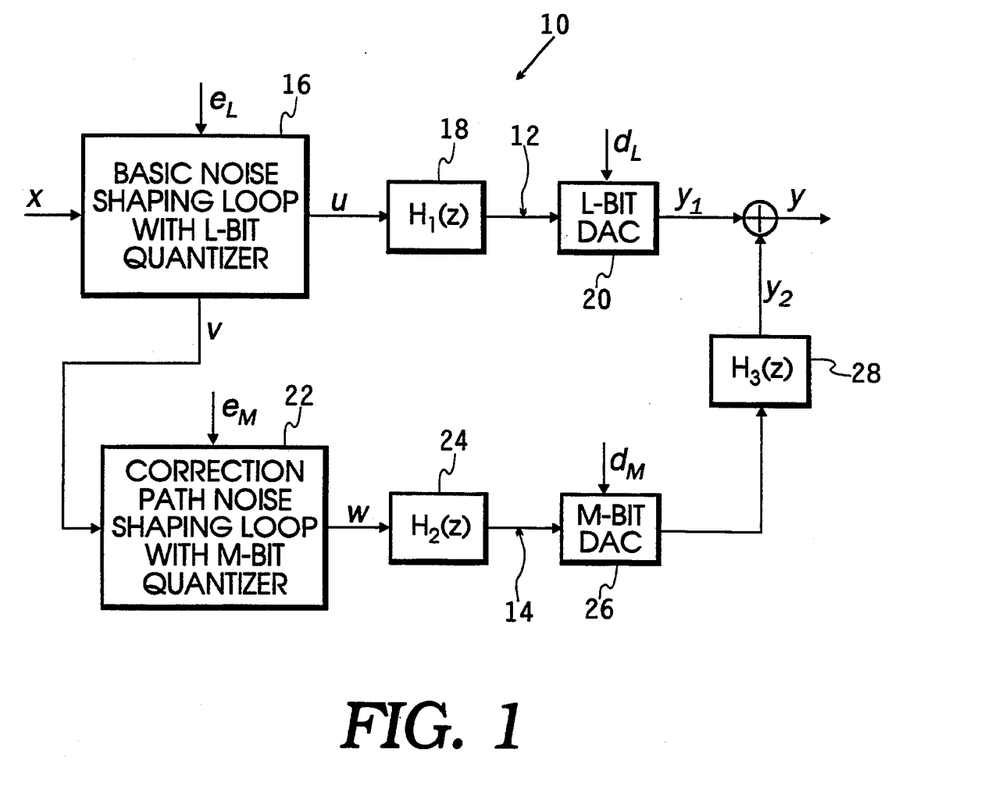
FIG. 1 is a block diagram of a oversampling D/A converter according to the invention.

FIG. 1 shows a general structure of an oversampling D/A converter system 10 according to the invention. The system 10 has two paths: a signal path 12 providing the signal y, and a correction path 14 providing a signal $Y_2$. As will be described, the correction path 14 contains elements that cancel the quantization error $e_L$ that is produced in the signal path 12 in the process of converting a digital input signal x into its analog equivalent signal y. The correction path 14 does, however, introduce a smaller quantization error $e_M$ which is minimized in a manner to be described.

Signal path 12 is similar to signal paths in conventional oversampling D/A converters and comprises a noise-shaping loop 16 followed by an optional delay stage 18 and an internal L-bit linear D/A converter 20. The noise-shaping loop 16 includes an L-bit quantizer that produces a large L-bit digital quantization error $e_L$ in the process of quantizing its digital input signal to L significant bits. The quantization may be performed by either truncating or rounding the digital input signal to its most significant bits. An L-bit digital signal u, which includes the digital input signal and the noise-shaped error $e_L$ is generated by the loop 16 and passed to the optional delay stage 18. The delay stage 18 may be placed in the signal path 12 to balance signal propagation delays that occur in the correction path 14. The delayed signal u passes through stage 18 to the linear D/A converter 20, which converts the signal u into an analog signal $y_1$. In the process, the D/A converter 20 introduces a nonlinearity error $d_L$, whose value may vary from zero to a significant magnitude depending on the linearity of D/A converter 20. The resultant analog signal $Y_1$ thus includes the quantized L bits of signal x, the error $e_L$ and the error $d_L$. In practical implementations, $d_L$ must be very small.

The correction path 14 comprises another noise-shaping loop 22 followed by a filter stage 24, an M-bit internal D/A converter 26 and another filter stage 28. The noise-shaping loop 22 includes a second quantizer of M bits, where M is preferably much greater than L. The M-bit quantizer receives as its input the negative magnitude of error $e_L$ (contained in signal v in FIG. 1) and generates a small M-bit digital quantization error $e_M$ in the process of quantizing $e_L$ to M significant bits. The error $e_M$ is much less than $e_L$ because the height of each quantization step in the M-bit quantizer is much smaller than in the L-bit quantizer. As in loop 16, the quantization may be by either truncating or rounding the signal v to its most significant bits. The loop 22 produces a digital signal w which includes the M significant bits and the error $e_M$ therein. The filter stage 24 is a high-pass filter that reduces the part of the error $e_M$ which appears in the baseband, and passes the resultant filtered signal to the D/A converter 26. The filtered signal is thus an M-bit representation of the shaped negative of $e_L$. The filter 24 may increase the wordlength of the signal from M bits to a large value M' bits. In that case, the D/A converter 26 should be an M'-bit converter. The D/A converter 26 converts the filtered signal into an analog signal $y_3$. In the process, the D/A converter 26 introduces a nonlinearity error signal $d_M$ into signal $y_3$. The signal $y_3$ is applied to another high-pass filter stage 28 to reduce the part of the error $d_M$ which appears in the baseband. The analog signal $y_2$ at the output of the stage 28 is thus ideally the analog form of a negative noise-shaped $e_L$.

The signal path 12 and correction path join at a summing node 30 where the signals $y_1$ and $y_2$ are combined into the analog output signal y. The quantization error $e_l$ and its negative, $-e_L$, cancel each other out at node 30, leaving an analog signal corresponding to the L bits of the input signal x, the filtered errors due to $e_M$ and $d_M$, and the nonlinearity error $d_L$. These filtered errors are much smaller than the cancelled L-bit quantization error $e_L$. If the L-bit D/A converter 20 is a one-bit or a three-level D/A converter, then the D/A converter is linear and the nonlinearity error $d_L$ is essentially zero. The output signal y is then passed through a simple analog low-pass filter (not shown) for extracting the baseband signal therefrom.

It will be understood by those skilled in the art that the various filter stages and correction path noise shaping loop shown in FIG. 1 are intended to be symbolic and that many arrangements of such stages are possible to carry out the required filtering of signals in the signal path 12 and correction path 14. The arrangement and actual transfer functions of these stages is dependent on the implementations chosen for the noise-shaping loops 16 and 22 and the D/A converters 20 and 26. Accordingly, the following specific implementations of the system 20 are intended only to be examples for teaching the invention and not limitations on the scope of the patent claims.

A First Implementation

Figure 2:
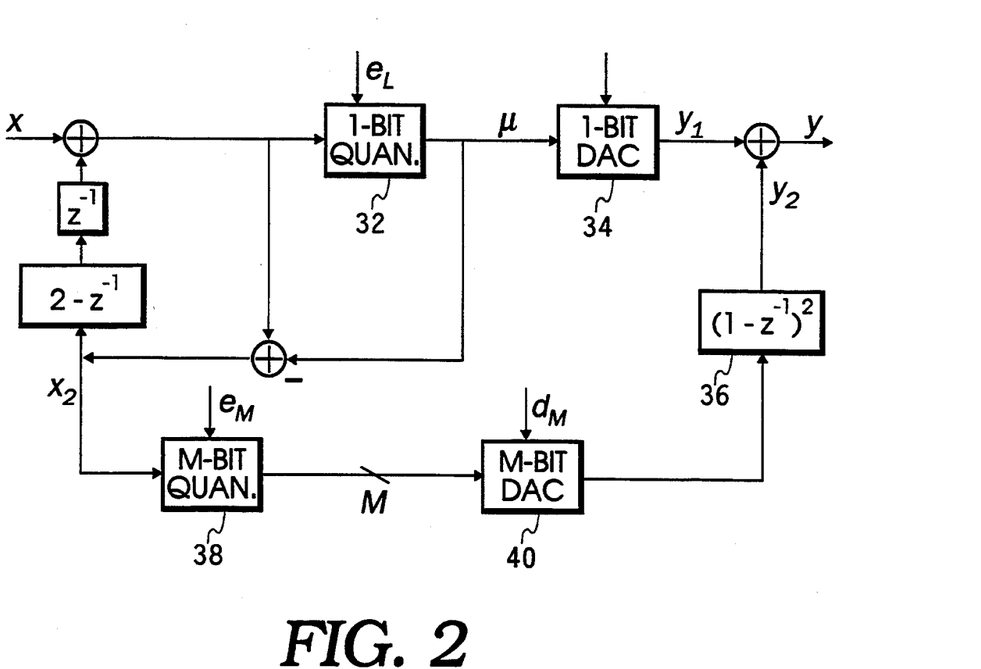
FIG. 2 is a block diagram of a first implementation of the oversampling D/A converter of FIG. 1.

FIG. 2 shows a first implementation of the system 10, where reference numerals different from the numerals in FIG. 1 are used to identify the significant elements of the implementation. With L equal to one, the quantized signal u from a one-bit quantizer 32 within the noise-shaping loop contains the input signal x and a second-ordered high-pass filtered error $e_1$. The signal u is converted into analog form by a one-bit linear D/A converter 34. Filter stages 18 and 24 are omitted, as is the correction path noise shaping loop 22, and filter stage 28 is an analog high-pass filter 36 with transfer function $(1-z^{-1})^2$. The filter stage 36 attenuates in the baseband both the quantization error $e_M$ from an M-bit quantizer 38 and the nonlinearity error $d_M$ from an M-bit D/A converter 40. After adding signals $y_1$ and $y_2$, the z transform of the system output signal y is $$Y = X + (1-z^{-1})^2(E_M + D_M) \quad (1)$$

Hence, in the baseband the error consists only of the attenuated small errors $e_M$ and $d_M$.

A Second Implementation

Figure 3:
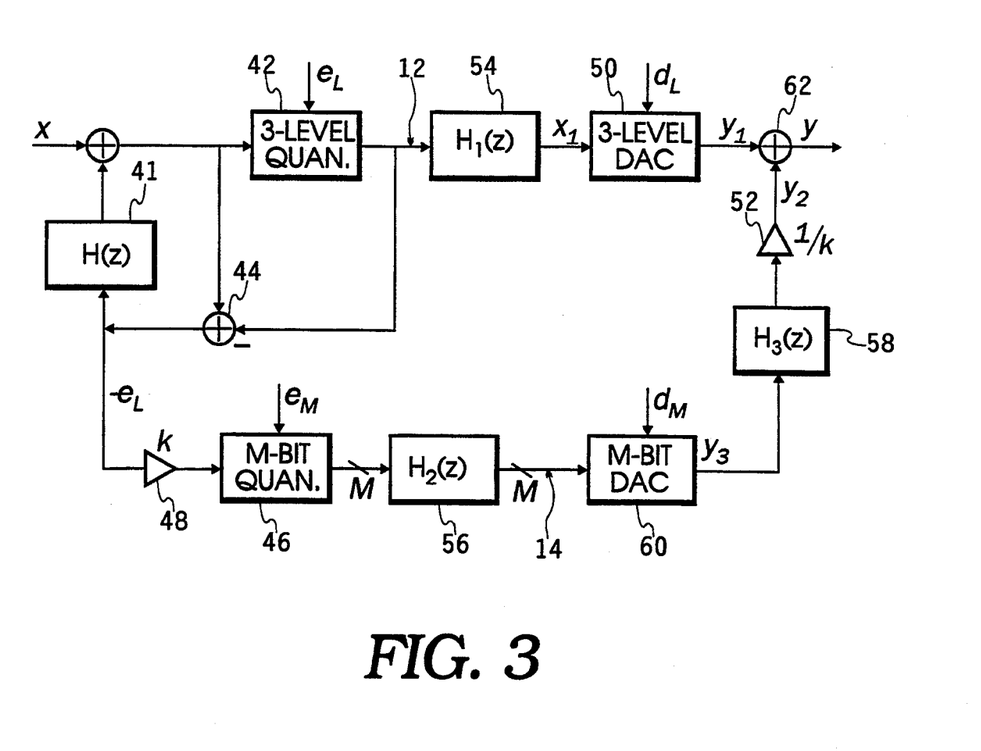
FIG. 3 is a block diagram of a second implementation of the oversampling D/A converter of FIG. 1.

FIG. 3 shows a second implementation of an oversampling D/A converter system according to the invention, where L is greater than one.

In this implementation, the noise-shaping loop 16 includes a filter stage 41 and a three-level quantizer 42, whose output is subtracted from the loop's input at a summing node 44 to produce the negative quantization error $-e_L$. The noise shaping loop 22 includes here only an M-bit quantizer 46 and a scaling block 48 of factor k to optimize the signal amplitudes in the correction path 14. The quantizer 46 quantizes the error $k(-e_L)$ into an M-bit signal that also includes its own quantization error $e_M$. The linear D/A converter 20 is preferably a three-level D/A converter 50 and can be implemented in a switched-capacitor (SC) circuit with high linearity so that the error $d_L$ is very small. The other elements of this second implementation include a second scaling block 52, filter stages 54, 56 and 58, an M-bit D/A converter 60 and a summing node 62.

If the filter stage 54 is omitted ($H_1 = 1$) and scaling block 48 is unity ($k = 1$), then the z-transforms of the signals in FIG. 3 are related by $$y_1 = X + H_N E_L \qquad (2)$$

$$y_2 = H_2 H_3 (-E_L + E_M) + H_3 D_M \qquad (3)$$

$$Y = y_1 + y_2 \qquad (4)$$

where $H_N = 1 - H$ is the noise transfer function of the noise shaping loop 16. If $H_2 H_3$ is chosen to equal $H_N$, then $E_L$ is cancelled in Y and $$Y = X + H_N E_M + H_3 D_M \qquad (5)$$

results. Thus the smaller error $e_m$ replaces the larger error $e_L$ as the quantization error in the signal y, and the nonlinearity error $d_M$ of the M-bit D/A converter 60 is filtered by stage 58 ($H_3$). With second-order noise shaping characteristics desired, the following transfer functions are selected for filter stages 41, 56 and 58:

$$H_2 H_3 = H_N = (1 - z^{-1})^2 \qquad (6)$$

$$H = 1 - H_N = 2z^{-1} - z^{-2} \qquad (7)$$

The choice of $H_2$ and $H_3$ for a fixed $H_2 H_3 = H_N$ involves a tradeoff of analog circuit design difficulties for realizing $H_3$ with design difficulties for realizing the M-bit D/A converter 60. To make $H_3$ easily implemented, $H_2$ is chosen to equal $H_3$:

$$H_2 = H_3 = 1 - z^{-1} \qquad (8)$$

Figure 4:
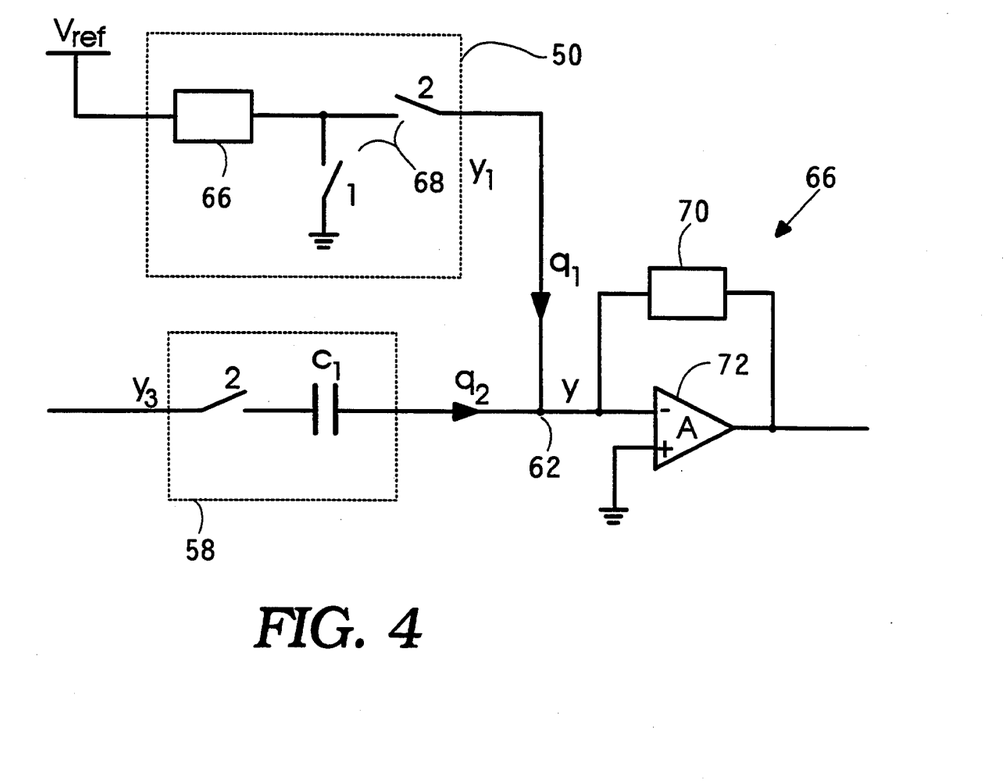
FIG. 4 is a schematic diagram of a single-bit D/A converter and a first-order analog differentiator for use in the oversampling D/A converter of FIG. 3.

FIG. 4 shows a switched capacitor circuit. The signals $y_1$ and $y_2$ are the same signals indicated in FIG. 3 and are represented by charges $q_1$ and $q_2$, respectively, combining at node 62. $H_3$, which is the transfer function of the analog filter stage 58, may be implemented as a single non-reset capacitor $C_1$. The three-level D/A converter 50 is linear in design and may be formed of capacitors 66 and switches 68 as is known in the art.

The output signal y that results from combining signals $y_1$ and $y_2$ enters an analog low-pass filter 66 (smoothing filter), which comprises capacitors and switches 70 and an operational amplifier 72.

To avoid a degradation of signal-to-noise ratio when the oversampling ratio is 128, the linearity of the M-bit D/A converter 60 in FIG. 3 must exceed $M + 6$ bits. When $M = 5$, for example, a D/A converter with 11-bit linearity is desired. This can be achieved most easily in a pipelined architecture, such as is known in the art and described for example in Wang and Temes, "A Quasi-passive CMOS Pipeline D/A Converter," *IEEE J. Solid State Circuits*, pp. 1752–1755, December 1989. When R32, a 5-bit D/A converter with 9-bit linearity is adequate for 14-bit overall resolution.

H2, which is a digital filter stage 56 in the implementation of FIG. 3, may have the same transfer function as $H_3$, $H_2 = 1z^{-1}$, and may then be implemented as a digital high-pass filter 56 located between the quantizer 46 and D/A converter 60. The values of scaling factors k and 1/k for stages 48 and 52, respectively, are chosen such that stage 56 does not cause overloading of the D/A converter 60. Simulation indicates that a scale factor $k = 182$ for stages 48 and 52 leads to an optimal result for the implementation discussed above.

Figure 5A:
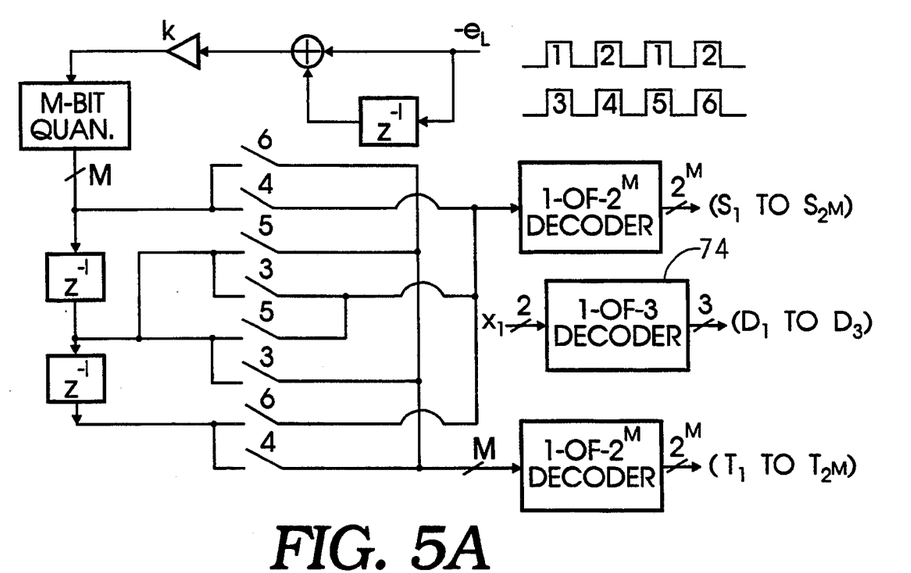
FIG. 5A is a schematic diagram of internal D/A converters.
Figure 5B:
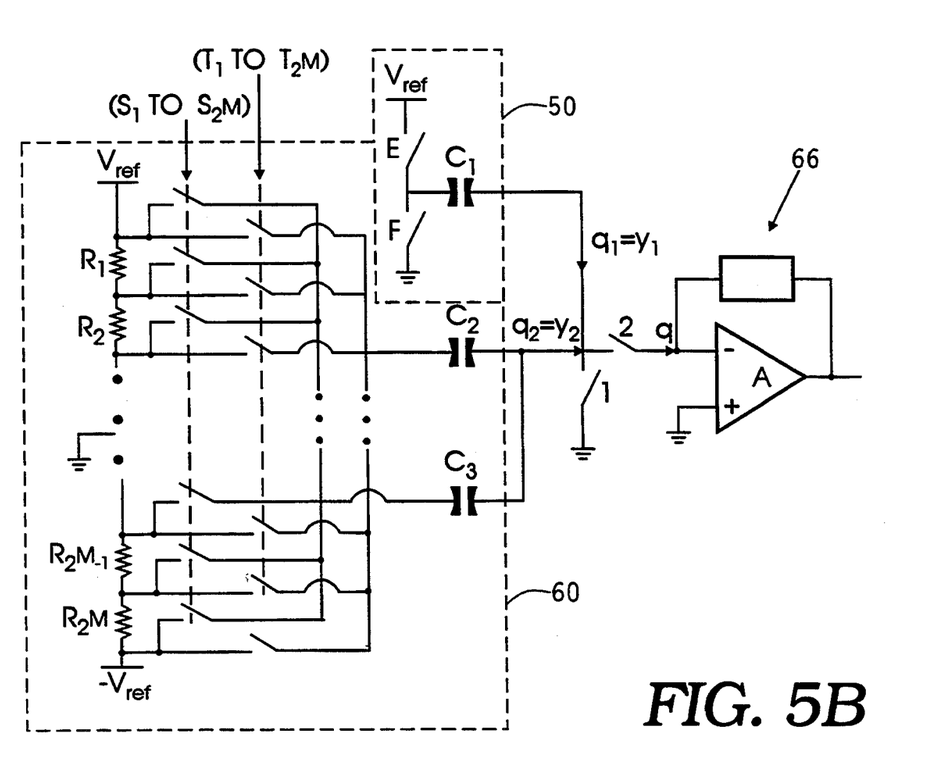
FIG. 5B is a schematic diagram of a second-order analog differentiator for use in the oversampling D/A converter of FIG. 3.

FIG. 5B shows a circuit for reducing the linearity requirements of the M-bit D/A converter 60 at a cost of increasing the complexity of filter stage 58 ($H_3$). The transfer functions for stages 56 and 58 ($H_2$ and $H_3$) can now be chosen as $H_2 = 1$, $H_3 = (1 - z^{-1})^2$. In this case the linearity of the D/A converter 50 can be as low as $M + 1$ bits.

A simple choice for implementing the $H_3$ transfer function would be to cascade two blocks, each containing an operational amplifier realizing the transfer function $(1 - z^{-1})$. A disadvantage of this cascade implementation is that the linearity of the analog circuit realizing the first $(1 - z^{-1})$ factor may be jeopardized by large sample-to-sample voltage swings. To reduce the nonlinear effects of the analog circuitry, the large high-frequency noise originating from the error $e_L$ must be prevented from entering any analog circuit except the sampling capacitors $C_1$, $C_2$ and $C_3$ which connect the D/A converters 50 and 60 to the filter 66 in FIGS. 3 and 4.

Preventing passage of the noise may be achieved in a number of ways. For example, FIG. 5B shows the use of digital delay lines and sampling capacitors $C_1$, $C_2$ and $C_3$ for performing the summation of the corresponding delayed analog signals. The signals $x_1$, $e_L$, $y_1$ and $y_2$ correspond to the signals shown in FIG. 3. The switches E, F and the capacitor $C_1$ form the three-level D/A converter 50, which is controlled by the outputs of the 1-of-3 decoder 74, shown in FIG. 5A. The possible values of the charge $q_1$ (which represents the signal $y_1$), are $\pm C_1 V_{ref}$ and 0.

The charge $q_2$ (which represents the signal $y_2$) is given by $$q_2(n) = C_{2(3)}[y_3(n) - y_3(n-1)] - C_{3(2)}[y_3(n-1) - y_3(n-2)] \qquad (9)$$

where the signal $y_3$ is the voltage output of the M-bit D/A converter 60 formed by the resistor string and the $S_i$ and $T_j$ switches. As indicated in equation (9), $C_2$ and $C_3$ trade places in alternate clock cycles.

With the circuit in FIG. 5B, the high frequency noise power corresponding to the shaped three-level quantization error $e_L$ is cancelled in the sampling capacitors $C_1$, $C_2$ and $C_3$. Only the signal x, the shaped M-bit quantization error $e_M$ and the shaped M-bit D/A converter error $d_M$ enter the filter 66. Thus the swing of the filter output is small and hence settling and nonlinear effects are greatly reduced.

However, the M-bit D/A converter 60 shown in FIG. 5B cannot easily be implemented in a pipelined structure. D/A converter 60 must have a parallel operation to provide two outputs simultaneously, such as the resistor string with two sets of switches shown in FIG. 5B.

A mismatch of the capacitors $C_2$ and $C_3$ produces unacceptable phase error, which is modulated out of the signal band by means of dynamic element matching. The element matching is achieved by interchanging capacitors $C_2$ and $C_3$ in alternating clock cycles as indicated in equation (9). This interchanging causes the noise spectrum around $f_s/2$ to be modulated into the signal band. Both theoretical analysis and simulation show this noise to be only first-order shaped. To have a second-order shaping of this noise, a digital function $(1+z^{-1})$ may be added in the correction path 14 before the noise enters the capacitors $C_2$ and $C_3$. As this function may cause overloading of the M-bit quantizer 46, a scaler $k=\frac{3}{4}$ is added to avoid overload.

The system shown in FIG. 3 has been extensively simulated to verify its performance. The circuit in FIG. 5A forms the correction path 14, with a block $(1+z^{-1})$ added in path 14 preceding the scaler block 48 (not shown). The filter stages 54 and 56 now have transfer functions $H1=H2=1$; the filter stage 58 has the transfer function $H3=(1-z^{-1})^2$; and $H=z^{-1}+z^{-2}-z^3$. H is chosen to achieve $H_N=(1z_{-1})^2(1+z^{-1})$. The factor $(1+z^{-1})$ is included in $H_N$ to balance the added factor $(1+z^{-1})$ in the transfer function of the correction path 14. The scaler k is $\frac{3}{4}$. The output levels of the three-level quantizer 42 are $\pm 2^{20}$ and 0. The M-bit quantizer 46 has 33 output levels.

Figure 6:
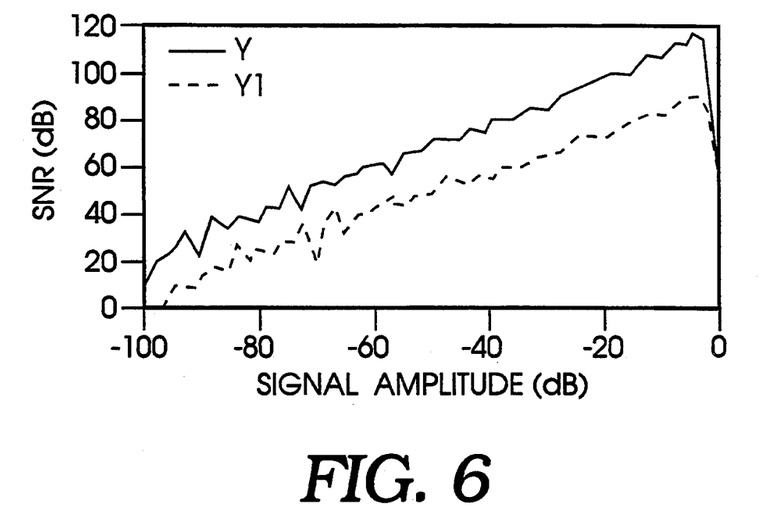
FIG. 6 is a graph illustrating the improvement in the signal-to-noise ratio of the output signal using an oversampling D/A converter with a single-bit and a 5-bit internal D/A converter according to the invention.

FIG. 6 compares the signal-to-noise ratio (SNR) of the signal $y_1$ to that of the signal y. The graphs show that the SNR is improved about 25 dB by the inclusion of the correction path 14 in system 10.

Figure 7:
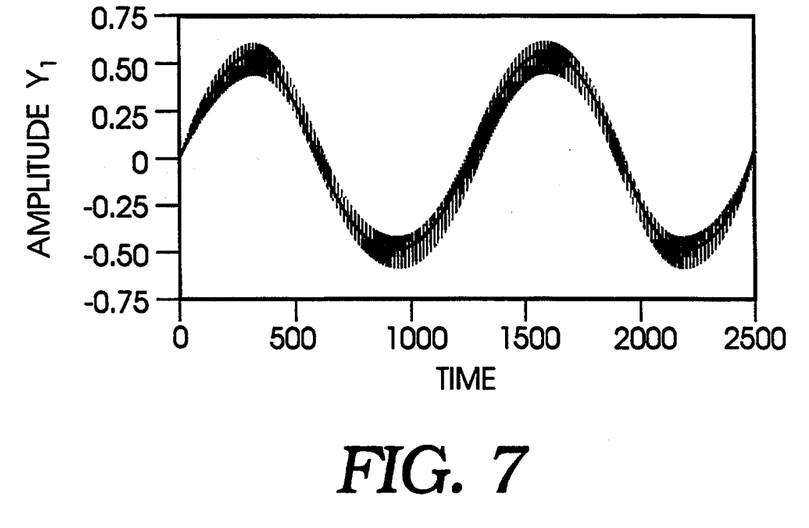
FIG. 7 is a graph illustrating the output signal waveform for a sine wave input using an oversampling D/A converter according to the invention.

FIG. 7 shows the waveform of the output signal y for a sine wave input to the system. The maximum sample-to-sample swing of the signal y entering the amplifier is reduced from $2V_{ref}$ for the system without a correction path 14 to $V_{ref}/4$ for the system 10 which includes path 14.

Having described and illustrated the principles of the invention with reference to preferred embodiments, it should be readily apparent to those skilled in the art that the embodiments can be modified without departing from such principles. We recognize that the principles of this invention can be applied to a wide variety of equivalent designs. For example, the transfer functions may be carried out by equivalent structures of various design in the different filter stages. Also, for simplicity, all circuit shown were single-ended structures. In fact, the preferred implementation is usually fully differential, to achieve a higher signal-to-noise ratio. Or, the signal v shown in FIG. 1 may contain not the error $-e_L$ but a shaped form of the input x as well as of $-e_L$. Therefore, the illustrated general structure and specific implementations should be considered as examples only of the preferred forms of the invention and not as limitations on the invention's scope. We claim as the invention all embodiments of the invention that come within the scope and spirit of the following claims.

We claim:

1. An oversampling digital-to-analog converter comprising:
    a first noise-shaping loop, including a first quantizer, for quantizing a digital input signal into a noise-shaped L-bit signal, the noise-shaping loop including a feedback path for feeding back a signal for combination with the digital input signal;
    a first digital-to-analog converter operably coupled to the first quantizer for converting the L-bit signal and an associated noise-shaped quantization error into a first analog signal;
    a second quantizer for quantizing a first quantization error produced by the first quantizer into an M-bit signal, where M is greater than L;
    a second digital-to-analog converter operably coupled to the second quantizer for converting the M-bit signal into a second analog signal;
    a filter operably coupled to the second digital-to-analog converter for shaping the first quantization error represented by the second analog signal; and
    means for combining the first and second analog signals to cancel the first quantization error contained in the first analog signal.

2. The digital-to-analog converter of claim 1 wherein one of the first and second quantizers truncates the signal it quantizes.

3. The digital-to-analog converter of claim 1 wherein one of the first and second quantizers rounds the signal it quantizes.

4. The digital-to-analog converter of claim 1 wherein the L-bit quantizer provides three digital signal levels and the linear digital-to-analog converter provides three analog output signal levels from a two-bit input signal.

5. The digital-to-analog converter of claim 1 including a delay stage coupled between the first quantizer and first digital-to-analog converter for delaying the first analog signal relative to the second analog signal.

6. The digital-to-analog converter of claim 1 wherein the filter is a high-pass filter coupled between the second digital-to-analog converter and the combining means for filtering a nonlinearity error generated by the second digital-to-analog converter.

7. The digital-to-analog converter of claim 1 including a high-pass filter coupled between the second quantizer and the second digital-to-analog converter for filtering the M-bit signal generated by the second quantizer.

8. The digital-to-analog converter of claim 1 wherein the second digital-to-analog converter is realized in a pipeline architecture.

9. The digital-to-analog converter of claim 1 wherein the negative value of the first quantization error is quantized by the second quantizer.

10. The digital-to-analog converter of claim 1 wherein L equals one and the first quantizer produces a one-bit digital signal for input into the first digital-to-analog converter, the first digital-to-analog converter being constructed for converting a one-bit, two level digital signal into the first analog signal.

11. The digital-to-analog converter of claim 1 wherein the second quantizer is embedded within a second noise-shaping loop operably coupled between the first noise-shaping loop and the second digital-to-analog converter for quantizing the first quantization error into a noise-shaped M-bit signal.

12. The digital-to-analog converter of claim 1 wherein the first noise-shaping loop includes:
    means for combining the digital input signal with a feedback signal produced in the loop; and
    the first quantizer for quantizing the digital input signal and a filtered quantization error.

13. A method for converting a digital signal to an analog signal, comprising:
    quantizing a digital input signal into an L-bit signal;
    feeding back a signal produced in the process of quantizing the input signal for combination with the digital input signal;
    converting the L-bit signal and an associated noise-shaped quantization error into a first analog signal;
    quantizing into an M-bit signal a first quantization error produced by the quantization of the digital input signal, where M is greater than L;
    converting the first quantization error into a second analog signal;

filtering the first quantization error represented by the second analog signal; and combining the first and second analog signals to cancel the first quantization error contained in the first analog signal.

14. The method of claim 13 wherein one of the quantizing steps comprises truncating the input signal or the error.

15. The method of claim 13 wherein one of the quantizing steps comprises rounding the input signal or the error.

16. An oversampling digital-to-analog converter comprising:
 a signal path including:
  a noise-shaping loop including a first quantizer for receiving a multibit digital input signal and reducing it to a digital signal with fewer bits which includes a quantization error, a feedback path for feeding a signal back for combination with the input signal, and a noise-shaping filter for shaping the quantization error; and
  a first digital-to-analog converter for converting the fewer-bit digital signal into a first analog signal;
 a correction path connected to the signal path and including:
  a second quantizer for quantizing the first quantization error of the first quantizer;
  a second digital-to-analog converter for converting the quantization error produced by the quantizer into a second analog signal; and
  a filter for shaping the first quantization error represented by the second analog signal; and
 means for combining the first analog signal from the signal path and the second analog signal from the correction path to cancel the first quantization error contained in the first analog signal.

17. The analog-to-digital converter of claim 16 wherein the second quantizer is embedded in a second noise-shaping loop that is operably coupled between the signal path and the second digital-to-analog converter of the correction path for quantizing the first quantization error into a fewer number of bits.

18. The analog-to-to-digital converter of claim 16 wherein the filter in the correction path and the noise-shaping loop in the signal path each shape the first quantization error in substantially the same way to suppress noise.

* * * * *